United States Patent [19]

Gates

[11] Patent Number: 4,908,827
[45] Date of Patent: Mar. 13, 1990

[54] FORWARD ERROR CORRECTION SYSTEM

[75] Inventor: John Gates, San Jose, Calif.

[73] Assignee: TIW Systems, Inc., Sunnyvale, Calif.

[21] Appl. No.: 77,800

[22] Filed: Jul. 27, 1987

[51] Int. Cl.$^4$ ............................................. G06F 11/10
[52] U.S. Cl. ......................................................... 371/43
[58] Field of Search ........................ 371/43, 44, 45, 46

[56] References Cited

U.S. PATENT DOCUMENTS

| | | | |
|---|---|---|---|
| 3,373,404 | 3/1968 | Webb | 371/37 |
| 3,697,950 | 10/1972 | Low et al. | 371/43 |
| 4,032,886 | 6/1977 | En et al. | 371/45 |
| 4,293,951 | 10/1981 | Rhodes | 371/43 |
| 4,539,684 | 9/1985 | Kloker | 371/45 |
| 4,641,327 | 2/1987 | Wei | 371/43 |

OTHER PUBLICATIONS

Berlekamp, Algebraic Coding Theory, McGraw-Hill, 1968, pp. 331-338.

Primary Examiner—Charles E. Atkinson
Attorney, Agent, or Firm—Flehr, Hohbach, Test, Albritton & Herbert

[57] ABSTRACT

The system first incorporates an encoder which utilizes a ½ rate convolutional encoder to encode the data and a supplementary coding system for converting the ½ rate coded data to a nominal ¾ rate. Thereafter, in order that the encoded data fits within the fixed frame length which has been adopted as a standard for the present TDMA transmission system, a portion of the excess data in each frame of encoded data put out by the encoder must be deleted or punched out. These bits are spaced throughout the frame to minimize the effect of the punchout routine.

On the decoding side of the system, bits must be reinserted in the same place where they were deleted in the encoder. Because these bits were removed at the encoder, the decoder cannot possibly know what they were. It is not important to know what they were, but rather when in the received bit stream they would have occurred. In these places, place holding bits that are marked as such are inserted. This function is achieved by arbitrarily inserting either 1's or 0's in the bit stream, and providing an accompanying bit stream which incorporates flag bits for marking the existence of these place holding bits. Later processing in the decoder then simply treats these bits as place holders. That is, they do not add information that can help correct errors, nor do they cause errors.

19 Claims, 5 Drawing Sheets

FORWARD ERROR CORRECTION SYSTEM

CROSS-REFERENCE TO RELATED APPLICATIONS

This invention is especially useful with the TDMA Terminal disclosed in the application of Joseph Deal, entitled A Multipoint TDMA Terminal, filed Dec. 6, 1985 under Ser. No. 805,616, and assigned to the Assignee of this invention.

BRIEF SUMMARY OF INVENTION

The present invention is directed generally to the field of digital satellite communication systems, and more particularly to an error correction scheme for use in such a system.

Communications channels of all types are subject to errors due to noise within the channel itself. It is desirable to eliminate, or at least reduce, the effects of these errors as much as possible.

There exist two distinct techniques for accomplishing this task. One technique requires detecting the presence of errors at the receiving end of the communications link, then informing the transmitting end that an error occurred. The data involved can then be retransmitted until it is correctly received. This type of error correction is known as Automatic-Repeat-Request (ARQ). This technique is mentioned herein only for completeness of presentation. The technique of interest to this application follows.

The second technique is to send a certain extra amount of information along with the original data. This extra information is derived from the original data stream itself in some manner known to the receiver as well as the transmitter.

When errors occur, the receiver uses the excess information to locate the errors and correct them without further communication with the transmitter. This type of correction is called Forward-Error-Correction (FEC).

There are two widely used types of forward error correction systems in common use in the communications industry: block codes, and convolutional codes.

Block codes have the property that the information to be coded is broken up into normally equally sized units of a convenient size. These blocks have data added to them in some manner that is dependent upon the data itself, creating a new block of somewhat larger size that may or may not resemble the original data. However, by understanding the coding scheme utilized, the new block of data can be analyzed and the original data extracted, even if errors have been created in the data.

Convolutional codes take a different approach. Convolutional codes work, not on blocks of data, but on a continuum of data. Data is serially and continuously passed into a circuit called an encoder. The encoder is of sufficient size to instantaneously look at the current data and some amount of previous data. The system then outputs a continuous stream of data at a higher rate, either more data being transmitted faster, or more data over a longer time period.

Block codes inherently lend themselves to a TDMA product such as used in satellite communication because of the inherent block structure of a TDMA. They are straight forward to implement and yield error performance gains that are very predictable.

Convolutional codes are generally more difficult to implement and performance prior to construction can only be approximated. In addition, they are by definition not structured into a block format. They have, however, one important characteristic. Convolutional decoders can make greater use of the received information more easily than block decoders.

This additional information is in terms of the quality of the received bit stream. Block decoders can easily only recognize that a received data bit is a one or a zero. Convolutional decoders can make use of information regarding how closely a particular received bit is to a perfect one or a perfect zero.

In other words, is the incoming data bit not only probably a 1 or a 0, but is there a high probability or a low probability that it is 1 or 0. This additional capability yields a dramatic improvement in the code's error correction performance.

The major drawback to using a convolutional coder is that due to the memory of past events required (remembering the description of the coder) excess data is generated that cannot be passed through the remainder of the TDMA system, because of the exactly fixed length of each frame of data to be transmitted. This excess data must somehow be stripped out.

Therefore it is an objective of this invention to provide an error correction system which is especially useful with a TDMA communications satellite system. Another objective of this invention is to provide a convolutional coder capable of operating in a TDMA environment. An objective of this invention to provide a convolutional coder which includes means for eliminating the excess data to provide frames of data for transmission of the defined frame length without a significant deterioration of the accuracy of the system.

A convolutional coder can operate in a TDMA environment which requires transmission of data frames of defined length by just periodically stopping and starting the coder at convenient places in the original data stream. This technique is referred to as truncation and is well documented in the literature of the art. However, though truncation does indeed yield a frame structure to a convolutional code, the size of the frame required turns out to be inconvenient.

To understand the modifications made in this invention of prior art approaches, the following definition must be understood. The rate of a code is the number of bits entered into the encoder divided by the number leaving it. Thus if 750 bits enter and 1000 are output the code is said to be an $R = \frac{3}{4}$ rate code.

In a convolutional code of the type described herein, a few extra bits must be forced or inserted into the encoder at the end of each input block of unencoded data in order to insure all information bits are equally encoded. This yields a number of output bits that is not the number desired by the system. Example: $R = I/O$.

$R$ = Real code rate
$I$ = Number of unencoded information bits
$O$ = Number of output bits from the encoder In a system where the convolutional coding technique of the present invention is used, the result of forcing extra bits into the encoder at the end of each block is that the number of actual output bits from the encoder will be $(I+T)/R$ where $T$ = Number of extra bits required to fully encode the unencoded information bits in each block of data.

As an example assume a coder that is nominally a rate $\frac{1}{2}$ coder with 100 input information bits and five additional bits required to thoroughly encode the original data. Then $O=(100+5)/\frac{1}{2}=210$.

But the desired number of output bits from the encoder to form a frame of data for TDMA transmission was only 200. The elimination of these excess 10 bits to form blocks of convolutional coded data for TDMA transmission is the objective of the present invention.

An objective of this invention to provide an improved type convolutional error correction scheme for use in systems where an $R=I/O$ relationship must be preserved.

A more specific objective of this invention is to permit the use of data bit elimination (or puncturing) in environments wherein the total number of output bits must be some exact number that is related to the original number of input information bits prior to the insertion of the excess bits required for the full encoding of the original data.

Yet another objective of this invention is to provide a system which provides for puncturing in combination with a data rate modification.

The invention will be useful with any type code conversion. It is disclosed here using several examples, including a ¾ rate coder.

It must be noted that puncturing or punchout of data bits is occurring for two different purposes in this system disclosure. Punchout of encoded data bits occurs to carry out a data rate conversion. In this invention, however, punchout must also occur for a second reason. That is, it usually occurs that the data output from the encoder is not in frames of the length which the system is designed to handle. That is, in the preferred embodiment being disclosed herein, the rate conversion does not produce a bit stream which is divided into blocks of exactly the same length as the frame of data to be transmitted in a typical transmission. To overcome this problem, the length of the blocks of data put out by the encoder must be modified to fit the defined frame structure length.

One cannot simply truncate the end of each block of the data stream. If these last few bits were just directly eliminated, necessary data would be lost because each original bit to be recovered by the decoder is determined by a sequence of bits received at the receiver.

Therefore, it is an object of this invention to develop method and apparatus whereby an error correction scheme may be provided in which data bits are eliminated to provide blocks of encoded data coding scheme without significantly weakening the error rate of the system.

In order to achieve the objectives herein, the system first incorporates an encoder which utilizes a ½ rate convolutional encoder to encode the data and a supplementary coding system for converting the ½ rate coded data to a nominal ¾ rate. Thereafter, in order that the encoded data fits within the fixed frame length which has been adopted as a standard for the present TDMA transmission system, a portion of the excess data in each frame of encoded data put out by the encoder must be deleted or punched out. Preferably, these bits are spaced throughout the frame to minimize the effect of the punchout routine.

It should be noted that the output of the encoder contains more bits for representing each block of data than the input. Thus information about the actual state of each input bit is represented in more than one output bit. Therefore, it is possible to punch out selected ones of the encoded bits without significantly degrading the accuracy of the encoded data.

On the decoding side of the system, bits must be reinserted in the same place where they were deleted in the encoder. Obviously, because these bits were removed at the encoder, the decoder cannot possibly know what they were. But according to the present system, it is not important to know what they were, but rather when in the received bit stream they would have occurred. In these places, place holding bits that are marked as such are inserted. This function is achieved by arbitrarily inserting either 1's or 0's in the bit stream, and providing an accompanying bit stream which incorporates flag bits for marking the existence of these place holding bits. Later processing in the decoder then simply treats these bits as place holders. That is, they do not add information that can help correct errors, nor do they cause errors.

It is recognized that this technique may degrade the error correction performance of the system to some limited extent. But if used in combination with a straight convolutional coding technique, the number of bits lost is so small as to not significantly affect performance. If used in combination with a rate changing technique to be described below, i.e., from the ½ code which results from the convolutional coding step to a ¾ rate code, the number of bits deleted to accomplish the rate conversion is so much greater than the number deleted of the excess bits in the tail portion (on the order of 100 to 1), the overall performance of the system is extremely close to that of a ¾ rate system, while being created utilizing standard components.

BRIEF DESCRIPTION OF DRAWINGS

The features and advantages of this invention will be more clearly understood from the following figures wherein.

DETAILED DESCRIPTION

Figure 1A:
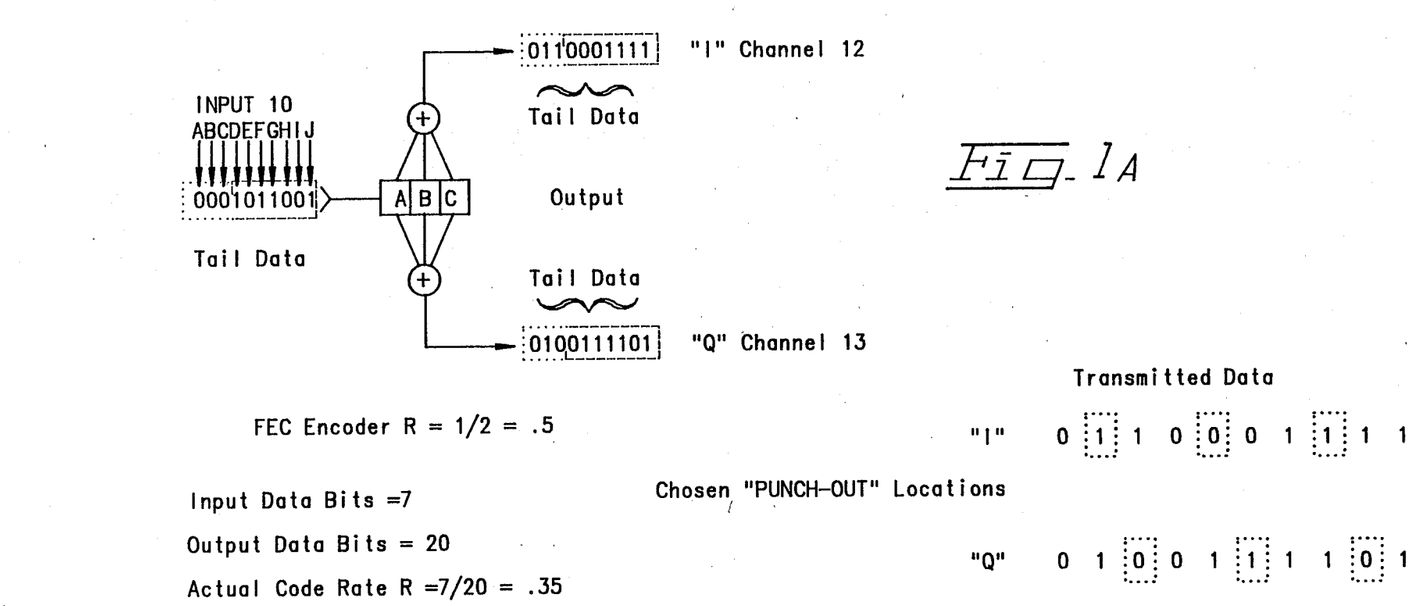
FIG. 1A shows the conversion of the incoming bit stream to, I, Q data.

It should be noted in reviewing this correction scheme that FIG. 1A shows a $k=3$ type encoder where k is the number of taps on the shift register 14. Other values for k can be used; but in this technology, $k=3$ is typically used for example purposes.

Figure 1B:
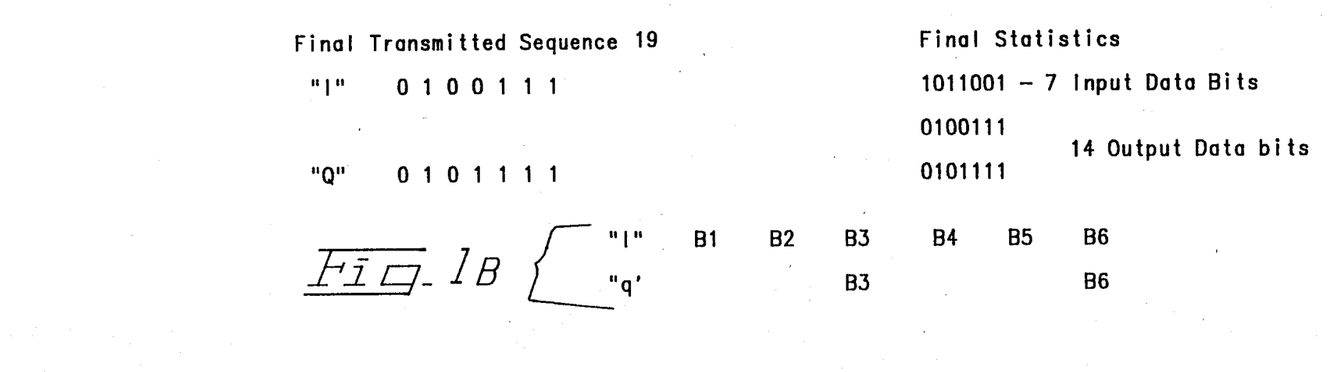
FIG. 1B shows a scheme for punching out data including theoretical approach to analysis of the errors produced by the punchout scheme of this invention according to the present invention.

In the type of code being generated according to the present system, at the outputs I, Q from the encoder 14 the original data is no longer found in the data stream; instead, a combination of several of the I, Q bits is used to reassemble the original data. Since several I, Q bits determine the value of each real data bit (when decoded), the effect of an error in transmission of any single I, Q bit is minimized. Therefore, a system such as shown in FIG. 1 is used where each real, unencoded data bit of the incoming data stream 10 can be reassembled from the outgoing data streams 12, 13 by analysis of a number of I and Q bits in the stream.

The IQ data is created using a shift register 14 comprising three stages 14 A, B, and C, and a pair of exclusive OR gates 16, 18 which combine the bits present at any given time in the shift register stages to form the IQ data streams 12, 13. This data stream is obviously ½ rate code. That is the output data strings 12, 13 on the I, Q channels have twice as many bits as the input data 10, at least for real data bits 10D-J.

However, when a block of incoming data bits 10 ends, e.g. at incoming bit 10D, the bit 10D will not be fully encoded unless it is shifted at least to the last stage 14C of the shift register 14. In order to completely clear the shift register 14 and insure full encoding of each data bit, a number of known bits must be shifted in at the end of the data block. These added or "tail" bits 10A, B, C will usually be all 0's. Thus in FIG. 1A we see an input bit stream of seven data bits D-J plus three excess generated tail bits A-C used to insure the full encoding of these seven input data bits. "Generated" bits means that these are not part of the original data.

The problem created by the fact that extra bits must be shifted in to clear the shift register (to fully encode the last input bits) is that excess output bits identified as the "tail data" of Channels I and Q result. Thus the encoded data no longer fits exactly into the block length to be transmitted. For example, to fully encode the last two input bits, two additional shifts must occur in the shift register 14. This results in four excess output bits, two in each of the I and Q channels. This causes the actual code rate to be $N/2N+2(k-1)$ where N equals the number of input bits and k equals the constraint length of the encoder, i.e., the number of elements the shift register is divided into. As N approaches infinity, the rate approaches ½, but always differs by the $2(k-1)$ constant.

According to this invention, the solution to this problem of the presence of excess bits in the I, Q channels is to punch out selected channel bits, and treat them as erasures in the decoder at the receive side of the system.

To review the example of FIG. 1A a ½ rate code is being applied to L bits of input 10 so that the output of the coder 14 is 2L channel bits on channels 12, 13. It is absolutely necessary to generate that amount. However, if every input bit is encoded an equal amount, when the last three bits of original data 10DEF are shifted into register 14, these three bits are left over, i.e., still in the shift register. Thus, if three more shifts are done to encode bits 10 DEF using as inputs dummy tail bits 10 A,B,C, the number of bits encoded is now $L+3$. The last three bits coming in are dummy bits (and it is irrelevant what their state is); but these added bits had to be used to push the remaining data bits through the shift register. The result is $2(L+3)$ actual output bits in data strings 12, 13, which amounts to six output bits too many as shown in FIG. 1. That is the basis of the problem. Previous attempts to address this problem used an approach which took the last three bits which were not fully encoded, shifted, i.e. repeated them at the front of the incoming data block, and ran them into the encoder first. Thus, when the last three bits are in the shift register, if does not matter that they are not fully encoded, because they have previously been encoded at the front of the data stream. However, the difficulty with this approach applies in the complexity of the decoder which just be used at the receive side of the system.

The concept of seeking out the number of bits needed to reduce the length of the output data to the desired block length, and preferably picking out those bits evenly spaced along the length of the data frame is an entirely new approach not previously considered which significantly reduces the complexity of the decoding system as well as minimizing the likelihood of error in the decoded data.

An example of how to punch out the excess data bits follows from an understanding of the coding procedure. It is most desirable to punch out equal numbers of bits from each data channel so the blocks remain of equal length. Also, both bits put out simultaneous on the I and Q channels should not be punched out, as this will effectively cause the loss of an instant in time.

Figure 2A:
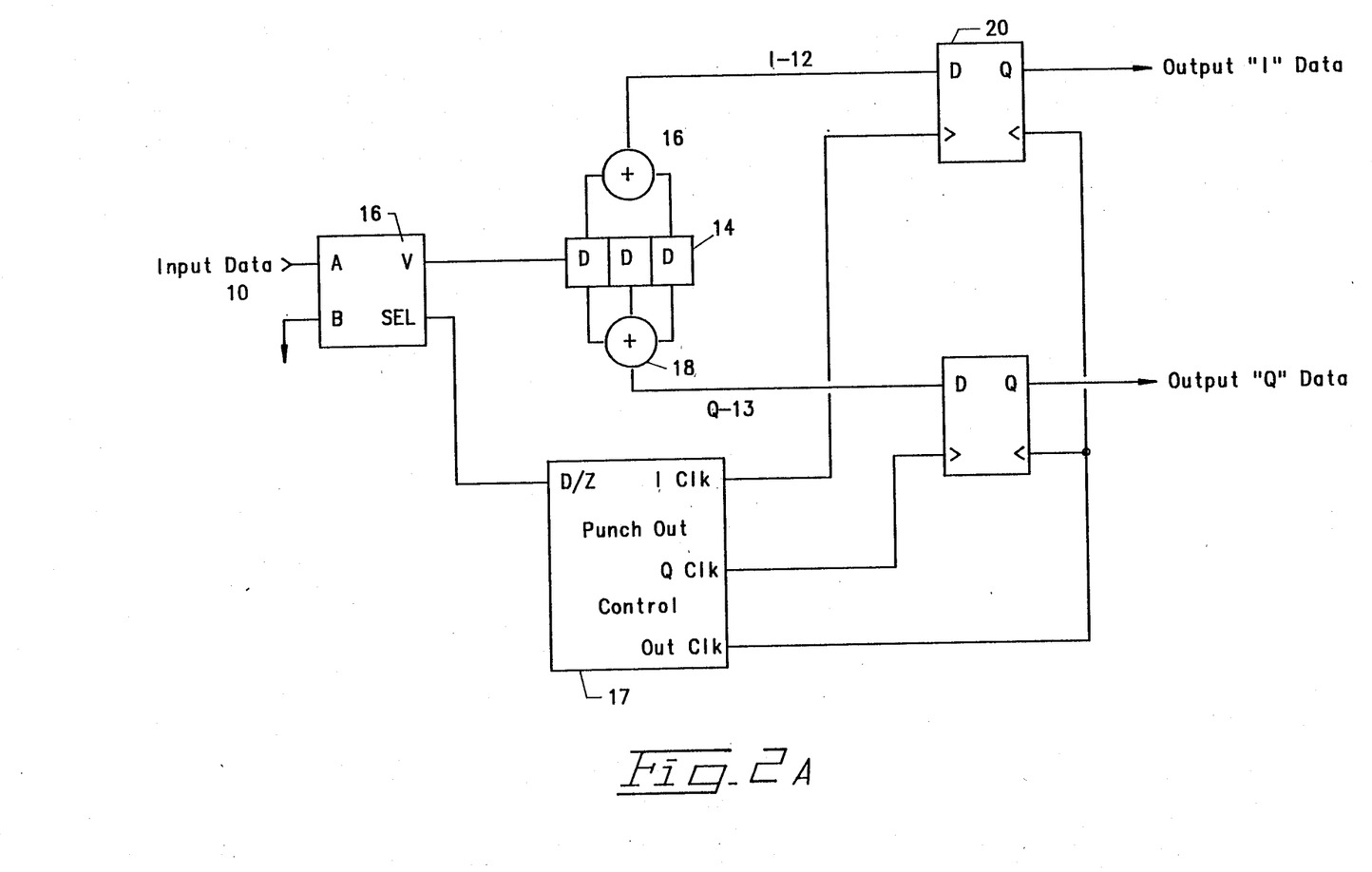
FIGS. 2A and 2B show the essential elements of the punchout electronics of the present invention.

FIG. 2A illustrates an embodiment of this invention. The input data 10 enters the multiplexer 15. As long as there is a valid input stream, the punchout control block 17 will allow it to proceed. When the data input stream is ended, the control block switches to the "B" input thus generating a sequence of zeros. Actually any sequence will do so long as it is known to the decoder. The length of this tail sequence (illustrated in FIG. 1A as 10A, B, C) must be at least as long as one bit less than the length of the shift register used in the convolutional encoder. It may be as long as desired beyond this length.

The resulting data block 10A-J (original desired plus tail) then is encoded in the normal manner.

The resulting bit stream is then clocked into a FIFO (first in first out) element 20 under the control of the punch out control unit 17. At certain predetermined bit positions no input (to the FIFO) clocking takes place. This effectively drops data from the bit stream resulting in the desired punching. The output bit streams are then clocked out to be further processed or directed over the channel.

If a second rate conversion puncturing is to take place (to be discussed below) it may take place either immediately prior to or sometime following the FIFO operation.

The decoder has a prior knowledge about all puncturing that has taken place. It performs operations that are the logical inverse of those performed in the encoder prior to the actual act of decoding the received reconstructed bit stream.

Specific details of block elements of the error correction system may be found in many references previously published; for example, "Development of Variable Rate Viturbi Decoder and its Performance Characteristics," pp. XII-24 through 30, Sixth International Conference on Digital Satellite Communications, incorporated herein by reference.

Books by Peterson and Welden, "Error Correction", and "Principles of Digital Communication and Coding" by Viturbi & Omura (McGraw-Hill) and Oppenheim's book on Digital Signal Processing are incorporated herein by reference for their discussion of trellis decoding of coded data signals.

The tail punchout electronics of this invention has been designed for use in a system whose block transmission length is further supported by a ½ to ¾ rate translation. The basis for puncturing to go from a ½ rate to a ¾ rate code is well known and extensively covered in IEEE Transactions on Information Theory. Therefore only a discussion of the necessary electronics is given below.

Simply put, to achieve a ¾ rate decoder additional bits must be deleted from each frame, i.e., in addition to the tail punch out bits. This is accomplished by initially ignoring the four extra i.e., tail bits in the I and Q channels, and converting the ½ rate code to a ¾ rate code by taking each group of six IQ bits as shown in the bottom of FIG. 1A, and deleting the last two of each set of three bits in the I channel. Now only the first I bit and all three Q bits remain. Looking again at the lower right of FIG. 1A, it can be seen that to complete the conversion, one more of the remaining four bits must be eliminated. In this case either the I bit, or the associated Q bit of the sole remaining complete pair must be deleted. After the data is transmitted, when the data is reformed on the receiver side, an additional clock pulse is added to denote the position of the deleted bit, and a flag bit is provided on an associated control line to indicate that the bit artificially created at the receiver in fact does not convey any information about the data being transmitted.

In an alternative embodiment of this invention, using a constraint length k=5 encoder, with summing taps on the first, third and fifth positions of the encoder to determine the polynomials which constitute the output data, the resulting of the multiplexer is a ½ rate encoder. As a result, for L information bits coming in, a total of 2L bits come out. As discussed above, it is actually 2(L+T), with T representing the extra bits that have to go into the tail. Using a K=5 encoder, the minimum number of bits that T can be for the system is four. The system (at the transmitter side) then does a bulk ½-rate to ¾-rate conversion. This is carried out in the ¾ rate conversion plus tail punchout system of FIG. 2. Essentially, to go from the ½ rate to ¾ rate, two of every set of six bits will be deleted, as shown at the bottom of FIG. 1A. The output of this system is ⅔ 2x(L+T) which is 4/3x(L+T). It is now necessary only to delete the few extra bits to eliminate the T factor. The actual number of bits to be "punched out" is determined as follows. Expanding the formula, the output of the ¾ rate conversion system is 4/3L+4/3T. Only whole bits can be deleted; a fractional bit cannot. Therefore, T must be set to be a number that is integrally divisible by three; further, the minimum number of bits to be deleted from the two lines is four. The smallest number over four that is divisible by three is six; and the more bits deleted, the weaker the code. 4/3(T=6) fixes the number of bits to be deleted at eight bits. Therefore, eight bits must be punched out, preferably equally spaced through the length of the frame.

Figure 2B:
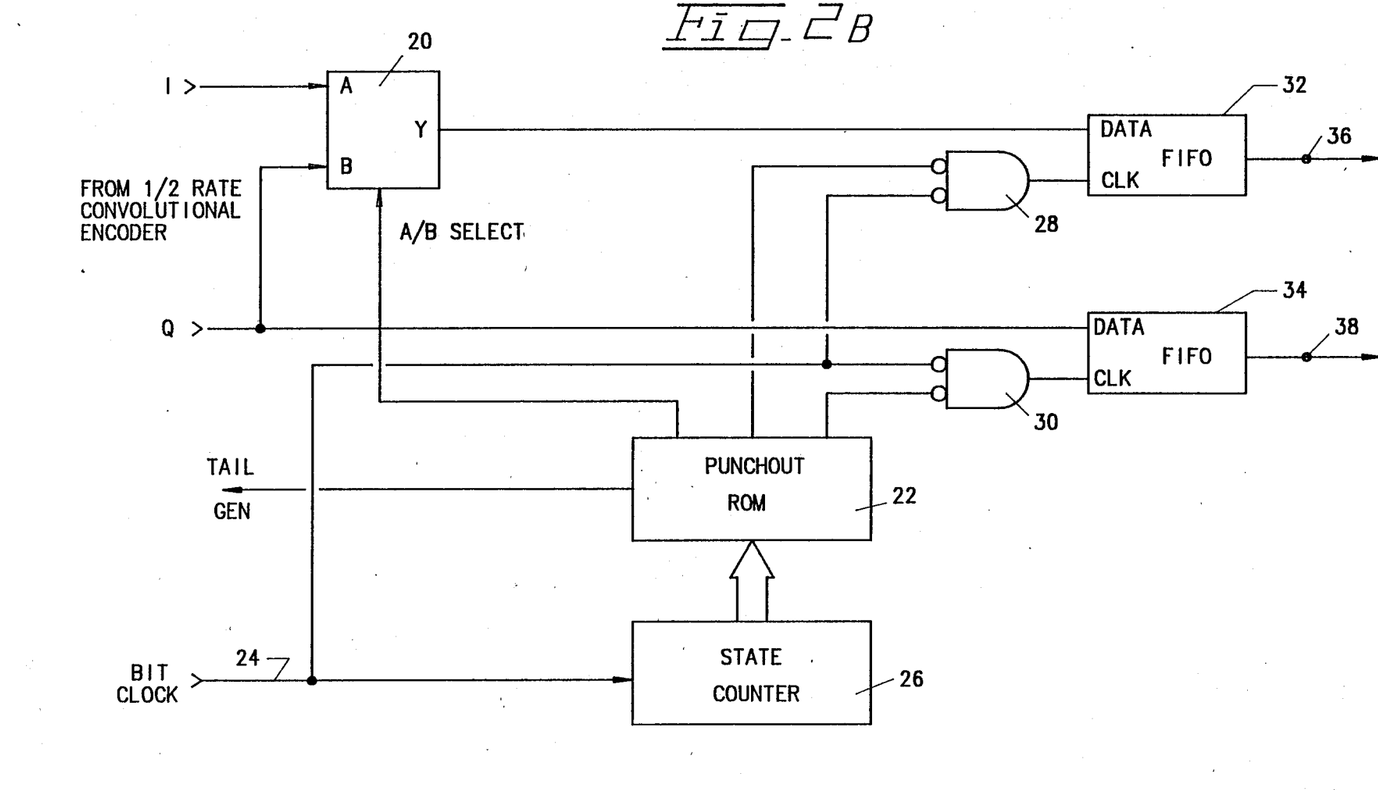

This is achieved in the circuit of FIG. 2B. It should be noted in reviewing the ¾ rate punchout device that in fact, the multiplexer 20 receives the inputs from both the I and Q data streams. The multiplexer effectively writes bits from the Q data stream over the I data stream ⅔ of the time, so that ⅔ of the bits in the I stream are eliminated. This is achieved under control of the punchout ROM 22, which responds to the bit clock input 24 through state counter 26 to continuously track the position of bits in each frame. In this way, bits are selectively eliminated from a data stream to accomplish the ½ to ¾ rate data conversion. Further, eight equally spaced bits throughout the frame are selected for additional deletion. The additional deletion is done through the output of the punchout ROM 22 connected through gates 28 and 30 to the clock inputs of FIFO devices 32, 34. When the clock input is held low, then no output appears on the output line, with the result that a bit can be selectively eliminated from either line of data in accordance with the pattern stored in the punchout ROM. By always punching out bits in the same location in each frame which is selected to have a punchout bit, a corresponding punch-in device 48b (FIG. 4) can be provided in the decoder side of the system, and a flag bit can be set on the receive side of the transmission system.

It should be noted that the FIFOs 32, 34 are provided solely for exercising punchout functions; without punching out the T bits, only the multiplexer would be necessary. The present system uses a 21 millisecond frame and a 32 kilobit voice channel, meaning that each frame comprises 672 bits. Thus, the output of multiplexer 20 must be reduced by 8 equally-spaced bits. In such a system, the state counter and punchout ROM simply count to 448, which is 672×4/3+½.

Specific bit locations are selected for punchout as follows. Looking at FIGS. 1A and 1B, it can be seen that since two of every three bits are already removed from one channel, only one bit remains eligible for punchout in that channel out of each set of three bits. However, if a bit, for example B3, is punched out in the Q channel, then the bit B3 cannot be punched out from the I channel or a complete increment of time is lost. Thus, there is a certain relationship between the bits which must be punched out in the two channels I and Q. The constraints which must be placed are that a corresponding bit in both the I and Q channel cannot be punched out, and the bits punched out in each frame should be separated as much as possible. Within these constraints, bits can be selected with the objective of simplifying the design of the hardware. One further constraint is that bits cannot be removed in a sequence which constitutes a relative prime number to the way the bits were eliminated in the ½-rate encoder.

Figure 3:
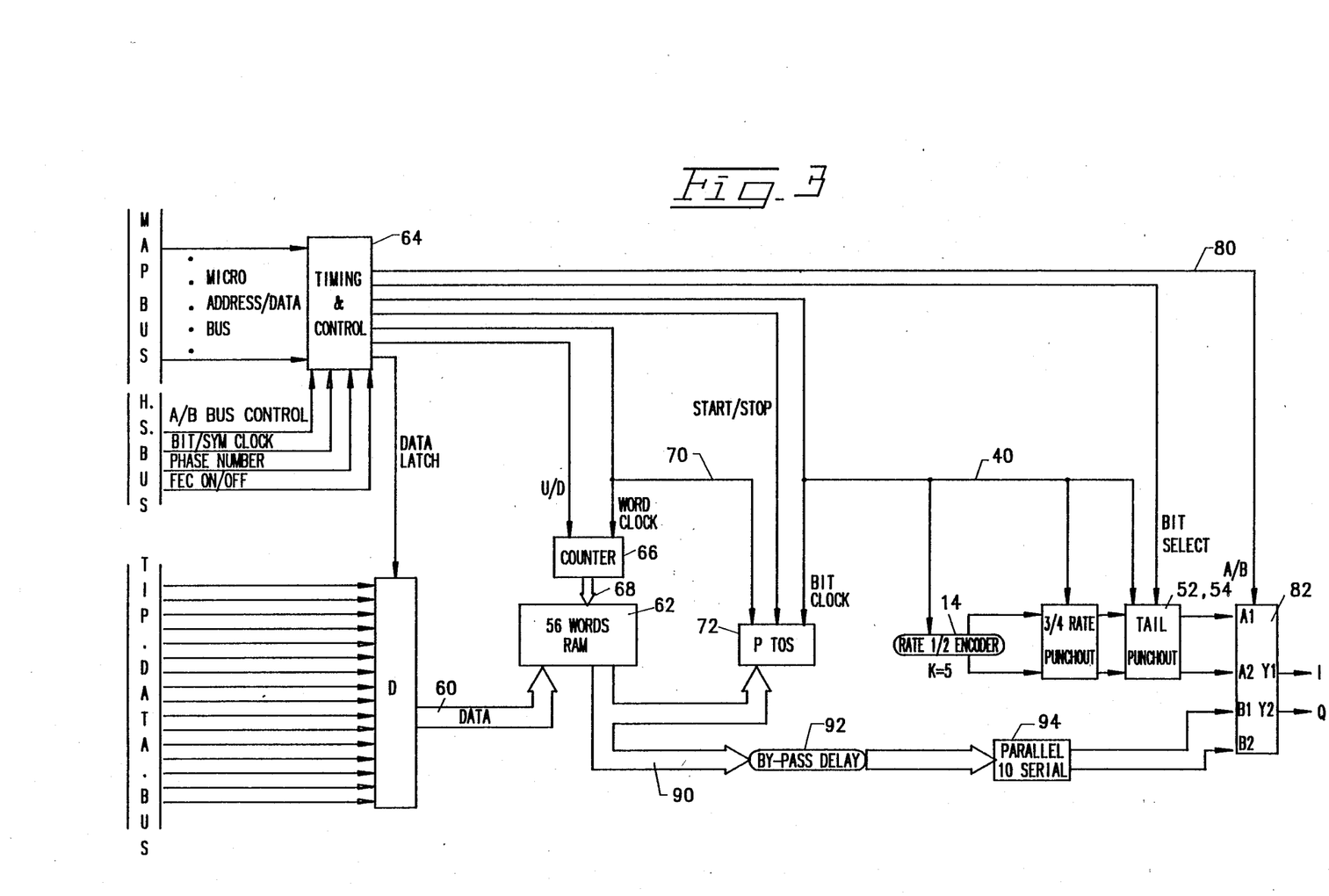
FIGS. 3 and 4 show in block diagram form the encoder and decoder of this invention, although these will not be described in great detail as they comprise elements which are standard in FEC implementations as well as interfaces to other boards of the TDMA system, and a complete description may be found in the incorporated application.

Turning to FIG. 3 which is a diagram illustrating how the forward error correction system fits into the overall data transmission system, it can be seen that the data from the TIP data bus which is the standard data bus on the transmission side of a satellite communication system feeds into the data bus 60 which in turns feeds the data into a 56-word RAM 62. The reason for the use of this RAM is that in decoding the data, the order of the data in each frame is reversed. Therefore, in order to take this into account, the order in which the data is transmitted is reversed in this RAM 62. Obviously, the timing for storing the data in this RAM as well as for punching out the bits in the tail punchout section 32, 34 and for transmitting it in the I and Q channels comes from a common timing source 64 such as is well known in the art and can be found in incorporated patents and applications. The signals to count data into the RAM and to clock the words are applied through the counter 66 and over the output 68 from this counter 66 to the control lines of the RAM 62, as well as providing a common word clock line 70 to the parallel-to-serial converter 72. This converter 72 operates on the data stored in the RAM 62 and provides it serially to the ½ rate encoder 14 and then to the ¾ rate encoder which essentially comprises the mux 20 and punchout ROM 22 and state counter 26, together with the tail punchout FIFOs 32, 34. The output of the tail punchout device 32, 34 is transmitted as timed by the AB signals from the common timing section on line 80 through the interface 82.

In an advantageous modification which is made available by the design of the claimed invention, it is possible to take data directly from the 56-word RAM 62 and convey it over the bus 90 through an appropriate bypass delay 92 which takes into account the time delay which occurs in the ½-rate and ¾-rate decoding circuits, and through a parallel-to-serial converter 94 into the interface 82.

In this way, voice level communications, which do not need to be error free to the high level in which data communications need to be transmitted can bypass the forward error correction circuit, making much more efficient use of the data transmission system of this invention. Further details of the overall system can be found in the above-incorporated Deal application.

Figure 4:
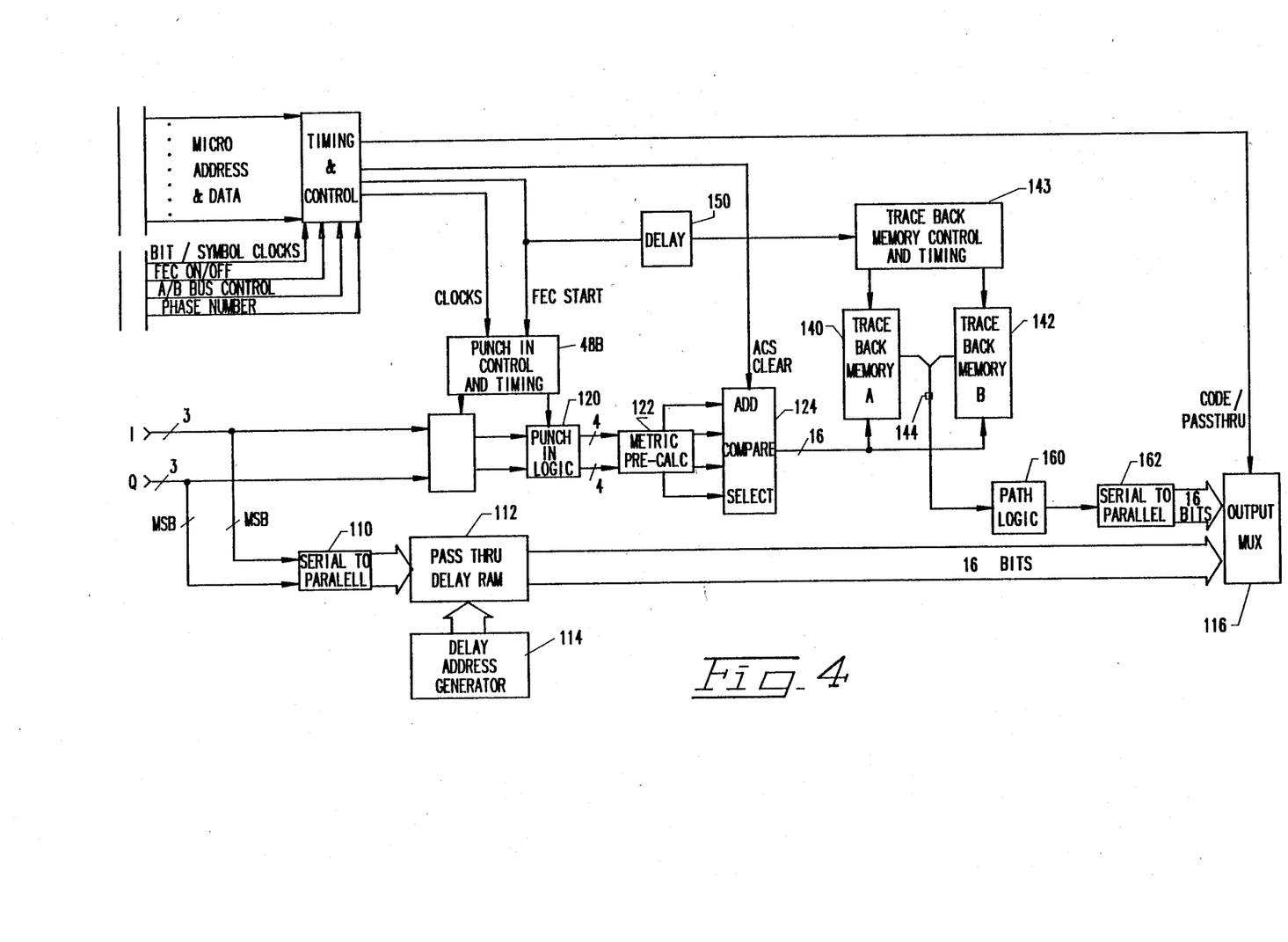

Turning to the decoder which is on the receive side of the system, the data which has bypassed the forward error correction system can be taken directly off the input lines and applied through serial-to-parallel converter 110 to a pass-through delay RAM 112. A delay address generator 114 is provided to apply the appropriate delay to this data to allow it to occur in its proper sequence with all the rest of the transmitted data at the output multiplexer 116. This delay address generator is simply a circular counter, i.e., a counter which constantly repeats a counting cycle simply to provide the necessary delay as the non-error coded data passes through the RAM 112 to the output multiplexer 116.

The punch-in control and timing denominated as element 48b operates in exactly the reverse fashion as the punchout ROM and state counter 42, 46. That is, it takes the input I Q data which is three bits wide and adds a fourth bit to it to indicate where bits have been punched out to reduce the number of bits in the frame to exactly the right number. In other words, where three bits are received, four bits will now appear on each of the output lines from punch-in logic device 120 together with (in our example where eight bits are punched out) eight flags appearing in the length of a total frame of 872 bits indicating the eight deleted punched-out bits to the metric pre-calc device 122. The metric pre-calc device 122 is a circuit designed in accordance with known techniques discussed in the incorporated books which takes into account the distance properties of the transmitted data and decodes the coded data which has been transmitted. The metric pre-calc 122 must receive the flag bits, so that it knows that in those eight places, the received data has been weakened to the extent of the removal of one bit. The metric pre-calc circuit 122 effectively takes two three-bit numbers arriving on the I and Q lines, and adds them together to get a four-bit number which represents the data originally coming out of the circuit shown in FIG. 1A. The output of the metric pre-calc device 122 to the add-compare-select system 124 consists of I Q, I Q', I' Q, I' Q'. The ACRS units represent the decoding trellis whose design was discussed in the references incorporated above. By appropriate comparison of the data outputs of the metric pre-calc 122 in accordance with known principles, the data as originally received and shown at 10 of FIG. 1A can be restored.

A pair of trace-back memories 140, 142 are provided to receive the 16-lines of output data from the ACS system 124. The trace-back memory control and timing 143 simply coordinates the receipt of the data in first memory 140 and then memory 142. While data is written in one memory, it is read out of the other memory. The memories then swap roles, with the data being read out on line 144 from the second memory, and read into the first memory. The delay 150 is obviously provided to coordinate the timing of this with the delay which occurs because of the use of the add-compare-select decoding trellis. It is necessary to use the two memories 142, 144 because of the high speed of operation of this system. Therefore, while data is being read out of one memory in one direction, it is being written into the other memory in the same direction. The operating direction of both memories is then reversed, reading data out of one while writing into the other. The result is a reversal of the order of the data, as occurs as explained above when discussing the encoder system.

Finally, the path logic 160 will look at the output of the ACS unit 124 and define exactly what was the input to the original encoder shown in FIG. 1A. After serial-to-parallel conversion at converter 162, this data will be presented to the output multiplexer 116 for transmission.

Alternative embodiments to the claimed invention may become apparent to a person of skill in the art who studies this invention disclosure. Therefore, the scope of the invention is to be limited only by the following claims.

What is claimed is:

1. A method of coding blocks of data received at an input for transmission in a satellite transmission system, the data being transmitted in frames each comprising a defined number of N bits, the method comprising the steps of encoding said blocks of data utilizing an encoder designed to satisfy R=I/O where R must be less than one, I is the number of unencoded bits in each said block of data fed into the encoder, O is the number of coded output bits coming out of the encoder, said encoding step including the steps of feeding each said block of I unencoded bits and a number of tail bits L into said encoder, operating on said I+L unencoded bits in said encoder to produce a number of encoded output bits O greater than N due to coding of said tail bits, and punching out a number of bits equal to O-N from said encoded data to provide said frame of encoded data comprising N bits.

2. A method as in claim 1 wherein each said block of N data bits is fed serially into said encoding means followed by a series of L non-data tail bits, said tail bits being fed in said encoding means to cause coding of all of said I input bits.

3. A method as in claim 2 wherein said encoding device comprises a shift register having x serial stages, where x−3, said encoding step comprising forming first and second channels of the data simultaneously present in the stages of said shift register.

4. A method as in claim 3 wherein the number of tail bits fed into said encoding means to fully encode said block of N data bits is no less than x−1, where x is the number of stages in the shift register.

5. A method as in claim 4 wherein said punching out step includes selecting locations for punching out said data equally spaced throughout said transmitted frame.

6. A method as in claim 5 wherein said first and second channels comprised serial strings of 0/2 pairs of encoded data bits, said punching out step being constrained so that both bits of one of said pairs of encoded data bits may not be eliminated.

7. A method as in claim 2 wherein said encoding step defines a first coding ratio, said punching out step including removing a plurality of said encoded bits from said output channels to define a second coding ratio greater than said first coding ratio.

8. A method as claimed in claim 7 wherein said punching out step includes selecting locations for punching out said data equally spaced throughout said transmitted frame.

9. A system for coding blocks of data received at an input for transmission in a satellite transmission system, the data being transmitted in frames each comprising a defined number of N bits, comprising encoding means for encoding said blocks of data utilizing an encoder coupled to said input and designed to satisfy R=I/O where R must be less than one, I is the number of unencoded bits in each said block of data fed into the encoder, O is the number of coded output bits coming out of the encoder, said encoding means including means for feeding said I unencoded bits and a number of tail bits L into said encoder, means for operating on said I+L unencoded bits in said encoder to produce a number of encoded output bits O greater than N due to coding of said tail bits, and means for punching out a number of bits equal to O-N from said encoded data to provide said frame of encoded data comprising N bits.

10. A system as in claim 9 including means for feeding each said block of N data bits serially into said encoding means followed by a series of L non-data tail bits, said tail bits being fed in said encoding means to cause coding of all of said I input bits wherein said frame comprising the data in said N input data bits is defined.

11. A system as in claim 10 wherein said encoding device comprises a shift register having x serial stages, where x=3, said encoding means comprising means coupled to different stages of said shift register for forming first and second channels of the data simultaneously present in the stages of said shift register.

12. A system as in claim 11 including means for feeding bits fed into said encoding means to fully encode said block of N data bits is no less than x−1, where x is the number of stages in the shift register.

13. A system as in claim 12 wherein said means for punching out includes means for selecting locations for punching out said data equally spaced throughout said transmitted frame.

14. A system as claimed in claim 13 wherein said means for defining said first and second channels includes separate data clocking devices each having a data input coupled to said shift register and a control input coupled to a punch out ROM and responsive thereto for selectively deleting bits from said shift register output to form a frame comprising N bits.

15. A system as in claim 14 wherein said first and second channels comprised serial strings of 0/2 pairs of encoded data bits, said punch out means comprising said punch out ROM having a pattern defined so that both bits of one of said pairs of encoded data bits may not be eliminated.

16. A system as in claim 9 wherein said encoding means defines a first coding ratio, said punching out means removes a plurality of said encoded bits from said output channels to define a second coding ratio greater than said first coding ratio.

17. A system as claimed in claim 16 including means for feeding each said block of N data bits serially into said encoding means followed by a series of L non-data tail bits, said tail bits being fed in said encoding means to cause coding of all of said I input bits wherein said frame comprising the data in said N input data bits is defined.

18. A system as claimed in claim 17 wherein said means for defining said first and second channels includes separate data clocking devices each having a data input coupled to said shift register and a control input coupled to a punch out ROM and responsive thereto for selectively deleting bits from said shift register output to form a frame comprising N bits.

19. A system as claimed in claim 17 including a separate channel including delay means coupled in parallel with said data channel comprising said punch out ROM, whereby a voice channel capacity is defined in parallel with said data channel transmitting said data frames.

* * * * *